US011482456B2

(12) United States Patent
Shen et al.

(10) Patent No.: US 11,482,456 B2
(45) Date of Patent: Oct. 25, 2022

(54) FORMING TWO PORTION SPACER AFTER METAL GATE AND CONTACT FORMATION, AND RELATED IC STRUCTURE

(71) Applicant: GLOBALFOUNDRIES U.S. Inc., Santa Clara, CA (US)

(72) Inventors: Yanping Shen, Saratoga Springs, NY (US); Hui Zang, Guilderland, NY (US); Jiehui Shu, Clifton Park, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 85 days.

(21) Appl. No.: 16/360,183

(22) Filed: Mar. 21, 2019

(65) Prior Publication Data

US 2020/0303261 A1  Sep. 24, 2020

(51) Int. Cl.
*H01L 21/8234* (2006.01)
*H01L 29/66* (2006.01)
(Continued)

(52) U.S. Cl.
CPC ........... *H01L 21/823468* (2013.01); *H01L 21/02164* (2013.01); *H01L 21/02167* (2013.01);
(Continued)

(58) Field of Classification Search
CPC ....... H01L 21/823468; H01L 21/02164; H01L 21/02167; H01L 21/31116;
(Continued)

(56) References Cited

U.S. PATENT DOCUMENTS 8,772,102 B2  7/2014 Chi
9,153,498 B2  10/2015 Xie et al.
(Continued)

OTHER PUBLICATIONS

Park et al., "Air Spacer MOSFET Technology for 20nm Node and Beyond," IEEE 2008, Department of Electrical Engineering and Computer Science, University of California, Berkeley, 4 pages.
(Continued)

*Primary Examiner* — Lex H Malsawma
*Assistant Examiner* — Eric W Jones
(74) *Attorney, Agent, or Firm* — Francois Pagette; Hoffman Warnick LLC

(57) ABSTRACT

A method of forming an IC structure includes providing a metal gate structure, a spacer adjacent the metal gate structure and a contact to each of a pair of source/drain regions adjacent sides of the spacer. The spacer includes a first dielectric having a first dielectric constant. The metal gate structure is recessed, and the spacer is recessed to have an upper surface of the first dielectric below an upper surface of the metal gate structure, leaving a lower spacer portion. An upper spacer portion of a second dielectric having a dielectric constant lower than the first dielectric is formed over the lower spacer portion. A gate cap is formed over the metal gate structure and the upper spacer portion. The second dielectric can include, for example, an oxide or a gas. The method may reduce effective capacitance and gate height loss, and improve gate-to-contact short margin.

15 Claims, 15 Drawing Sheets

(51) Int. Cl.
    *H01L 21/3213*    (2006.01)
    *H01L 21/311*     (2006.01)
    *H01L 21/02*      (2006.01)
    *H01L 27/088*     (2006.01)
    *H01L 29/49*      (2006.01)
    *H01L 29/423*     (2006.01)

(52) U.S. Cl.
    CPC .. *H01L 21/31116* (2013.01); *H01L 21/32136* (2013.01); *H01L 21/823475* (2013.01); *H01L 27/088* (2013.01); *H01L 29/42376* (2013.01); *H01L 29/4991* (2013.01); *H01L 29/6653* (2013.01); *H01L 29/6656* (2013.01); *H01L 21/0228* (2013.01); *H01L 29/66545* (2013.01)

(58) Field of Classification Search
    CPC ....... H01L 21/32136; H01L 21/823475; H01L 21/0228; H01L 27/088; H01L 29/42376; H01L 29/4991; H01L 29/6653; H01L 29/6656; H01L 29/66545
    USPC .......................................................... 257/407
    See application file for complete search history.

(56) References Cited

U.S. PATENT DOCUMENTS

| | | | |
|---|---|---|---|
| 9,293,576 B2 | 3/2016 | Cheng et al. | |
| 9,443,956 B2 | 9/2016 | Yu et al. | |
| 9,721,897 B1* | 8/2017 | Cheng | H01L 23/535 |
| 2013/0248950 A1* | 9/2013 | Kang | H01L 29/6656 257/288 |
| 2016/0149015 A1* | 5/2016 | Cai | H01L 29/78 438/294 |
| 2017/0352657 A1* | 12/2017 | Bergendahl | H01L 29/66545 |
| 2018/0040734 A1* | 2/2018 | Chang | H01L 29/42376 |
| 2018/0166553 A1* | 6/2018 | Lee | H01L 29/4991 |
| 2018/0269301 A1* | 9/2018 | Cheng | H01L 29/66795 |
| 2020/0044086 A1* | 2/2020 | Hsu | H01L 21/76843 |

OTHER PUBLICATIONS

Anonymous, "Vertically stacked bi-layer spacer," retrieved from ip.com Prior Art Database Technical Disclosure, Aug. 27, 2018, 4 pages.

* cited by examiner

FORMING TWO PORTION SPACER AFTER METAL GATE AND CONTACT FORMATION, AND RELATED IC STRUCTURE

BACKGROUND

The present disclosure relates to integrated circuit (IC) structure formation, and more specifically, to a method of forming a two portion spacer after metal gate structure and contact formation, and a related IC structure.

Manufacturing of IC structures requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gates may be composed of various metals and often include a work function metal (WFM) which is chosen to create desired characteristics of the FET, and a gate metal conductor over the WFM. Transistors may be formed over a substrate and may be electrically isolated with an insulating dielectric layer, e.g., inter-level dielectric (ILD) layer. Metal wires and contacts may be formed to each of the source, drain, and metal gate structures through the ILD layer to electrically connect the transistors to other circuit elements that may be formed subsequent to the transistor in other levels.

As the space between a metal gate structure and adjacent contacts to source/drain regions decreases, interactions between the structures pose challenges for continued miniaturization of IC structures. For example, parasitic capacitance with respect to the contacts (trench silicide (TS)) to source/drain regions is a major portion of effective capacitance in IC structures, and can impact overall performance. Reducing the effective capacitance of a transistor generally boosts the device performance. In addition, the ever-decreasing space between structures reduces the margins to prevent gate-to-contact electrical shorts. Low dielectric constant (low-K) spacers may isolate a metal gate structure from adjacent contacts to source/drain regions. Oxide spacers may be advantageous because oxide has a much lower dielectric constant than low-K materials. Oxide, however, is not compatible with current self-aligned contact (SAC) forming processes, e.g., it is damaged by contact etching and cleaning processes. Current SAC forming processes can also disadvantageously cause metal gate structure height loss.

SUMMARY

A first aspect of the disclosure is directed to a method of forming an integrated circuit (IC) structure, the method comprising: providing a metal gate structure over an active semiconductor structure over a substrate, a spacer adjacent the metal gate structure and a contact to each of a pair of source/drain regions in or on the substrate and adjacent respective sides of the spacer, wherein the spacer includes a first dielectric having a first dielectric constant; recessing the metal gate structure; recessing the spacer to have an upper surface of the first dielectric below an upper surface of the metal gate structure, leaving a lower spacer portion of the first dielectric; forming an upper spacer portion over the lower spacer portion, the upper spacer portion including a second dielectric having a dielectric constant lower than the first dielectric; and forming a gate cap over the metal gate structure and the upper spacer portion.

A second aspect of the disclosure includes an integrated circuit structure, comprising: a metal gate structure over an active semiconductor structure over a substrate; a spacer adjacent the metal gate structure, wherein the spacer includes a lower spacer portion including a first dielectric having a first dielectric constant and an upper spacer portion including a second dielectric having a dielectric constant lower than the first dielectric; a contact to each of a pair of source/drain regions in or on the substrate, each contact abutting the spacer; and a gate cap over the metal gate structure and the upper spacer portion of the spacer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
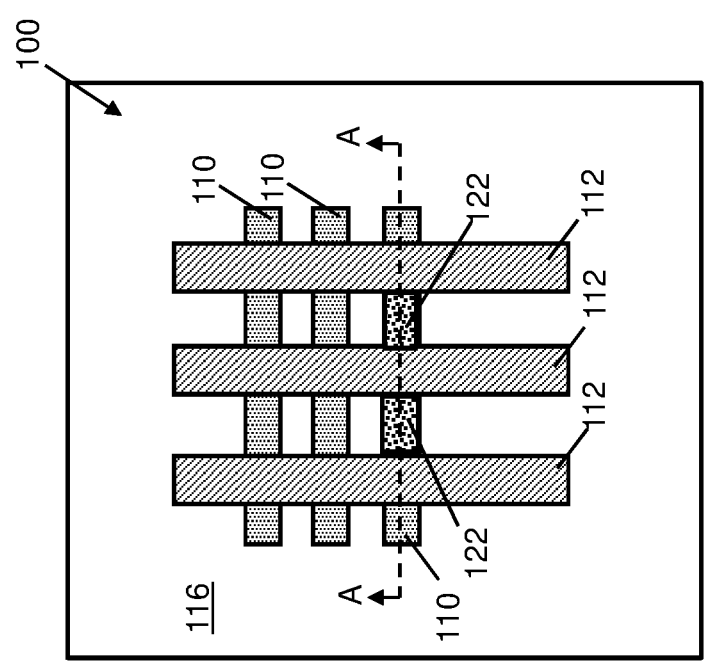
FIG. 1 shows a plan view of a preliminary structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide a method of forming an IC structure, and the related IC structure. Embodiments of the method may include providing a metal gate structure, a spacer adjacent the metal gate structure and a contact to each of a pair of source/drain regions adjacent sides of the spacer. The spacer may include a first dielectric having a first dielectric constant. The metal gate structure is recessed, and the spacer is recessed to have an upper surface of the first dielectric thereof below an upper surface of the metal gate structure, leaving a lower spacer portion. An upper spacer portion with a second dielectric having a dielectric constant lower than the first dielectric is formed over the lower spacer portion. A gate cap is formed over the metal gate structure and the upper spacer portion. The second dielectric can include an oxide or a gas dielectric. The method reduces effective capacitance and gate height loss, and improves gate-contact short margins.

FIG. 1 shows a plan view of a preliminary structure 100 to be processed according to embodiments of the disclosure. It is noted that the plan view of FIG. 1 shows some, but not all, parts of structure 100 for perspective relative to subsequent drawings that show more detail via a cross-sectional view along line A-A in FIG. 1. The example preliminary structure 100 of FIG. 1 provides one initial set of materials targeted for use with embodiments of the disclosure, but it is understood that embodiments of the disclosure may be implemented on different designs without significant changes to the various example techniques discussed herein.

Figure 2:
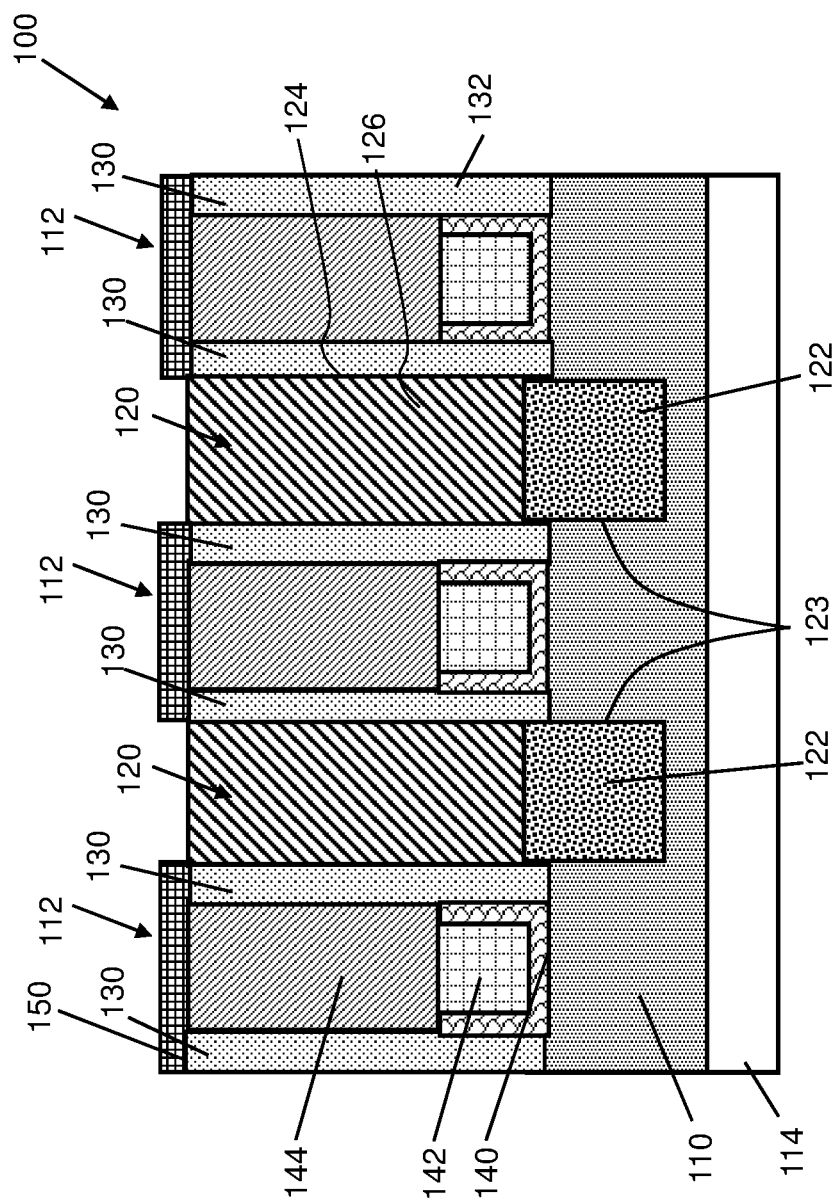
FIG. 2 shows a cross-sectional view of the preliminary structure of FIG. 1.

As shown in FIG. 1, preliminary structure 100 can include a set (i.e., one or more) of active semiconductor regions 110 extending in parallel with each other, with three regions 110 being provided as an example. Active semiconductor regions 110 are referred to as "active" because they form a part of a channel region of a transistor. For purposes of description, active semiconductor regions 110 will be described as semiconductor fins. It will be recognized by those with skill in the art that active semiconductor regions 110 can take a variety of forms, e.g., bulk semiconductor, semiconductor nanosheets, etc. Preliminary structure 100 may also include a set (i.e., one or more) of metal gate structures 112 extending transversely over active semiconductor regions 110 over substrate 114 (FIG. 2). A shallow trench isolation (STI) 116 (shown without cross-hatching in FIG. 1 solely for clarity) of preliminary structure 100, may be positioned underneath and/or adjacent to active semiconductor region(s) 110 and gate structure(s) 112. Line A-A in FIG. 1 creates a view line showing metal gate structure(s) 112 positioned over corresponding active semiconductor region(s) 110 in preliminary structure 100. Each active semiconductor region 110 may include source and/or drain regions 122 (simply "source/drain regions" or "S/D regions" hereafter) adjacent metal gate structure(s) 112. Contacts 120 (not shown in FIG. 1) to source/drain regions 122 (FIGS. 1 and 2) may be located, i.e., in a "source drain contact area" of active semiconductor region 110.

Methods according to the disclosure may include providing preliminary structure 100. As best shown in FIG. 2 with occasional reference to FIG. 1, embodiments of the disclosure may include providing a metal gate structure 112 over active semiconductor structure 110, e.g., a fin, over a substrate 114. The providing may also include forming a spacer 130 adjacent metal gate structure 112, and forming a contact 120 to each source/drain region 122 in or on substrate 114 adjacent respective sides of spacer(s) 130. Spacer(s) 130 may include a first dielectric 132 having a first dielectric constant (K1).

Preliminary structure 100 may be provided in a number of ways, e.g., by formation thereof, or otherwise obtaining the structure. A brief explanation of embodiments of forming preliminary structure 100 will be described. The brief description of preliminary structure 100 formation is only illustrative, and should not be considered limiting. Generally, preliminary structure 100 may be formed using any now known or later developed semiconductor fabrication techniques. For example, preliminary structure 100 may be formed using photolithographic techniques. In photolithography, a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example.

Each active semiconductor region 110 may be formed from an underlying semiconductor substrate 114, e.g., by removing targeted portions of substrate 114 to a predetermined depth, causing the non-removed portions to form active semiconductor regions 110 directly on substrate 114. Substrate 114 and active semiconductor regions 110 may include, e.g., one or more currently-known or later developed semiconductor substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Shallow trench isolation (STI) 116 (FIG. 1 only) may be positioned on substrate 114, as well as between active semiconductor regions 110 and metal gate structures 112. Each STI 116 (FIG. 1) may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. STI 116 may be formed by deposition. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. For example, STI 116 may be formed using CVD.

Source/drain (S/D) regions 122 may also be formed in or on active semiconductor regions 110. S/D regions 122 may be formed using any now known or later developed technique to distinguish the source or drain of a transistor from other regions of a semiconductor material. For example, S/D regions 122 may be formed within active semiconductor region 110, e.g., by forming openings 123 within active semiconductor region 110 and epitaxially growing another semiconductor material within the openings, thereby S/D regions 122 via epitaxy with a different material composition from the remainder of active semiconductor region 110. Dummy gates of sacrificial material in the location of metal gate structures 112 or the actual metal gate structure 112 and spacer 130 may shield a portion of active semiconductor region 110 when the epitaxial S/D regions 122 are being formed. S/D regions 122 may include the same semiconductor material of active semiconductor region 110, or a different semiconductor material, but with dopants therein. S/D regions 122, after being doped, may have a different composition from the remainder of active semiconductor region 110. To form S/D regions 122, selected portions of active semiconductor region 110 may be implanted with a strain-inducing material, such as silicon germanium or silicon carbon, formed on active semiconductor regions composed of silicon, silicon germanium, and/or silicon carbon. The dopants used to form S/D regions 122 may be introduced in situ or an implantation process may be performed to affect only S/D regions 122 of structure 100. According to an example, active semiconductor region 110 is not previously doped before S/D regions 122 are formed within structure 100. A doping process may be performed to dope active semiconductor region(s) 110 and S/D regions 122. If a lightly doped source/drain region is desired, the doping can occur after forming metal gate structures 112, but before forming spacer 130. An anneal may be performed to drive in dopants to form S/D regions 122.

Openings 123 for S/D regions 122 may be formed by etching. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In one example, openings 123 may be formed through RIE.

Metal gate structures 112 may be formed using any now known or later developed technique, e.g., photolithography alone or as part of a replacement metal gate (RMG) process. (RMG is a process in which sacrificial and replaceable dummy gates are used as a placeholder for metal gate structures during processing that would damage the metal gates, such as S/D region anneals.) Each metal gate structure 112 may include one or more functional components used in a high dielectric constant (high-K) metal gate. At this stage, even where metal gate structure 112 is formed using an RMG process, metal gate structure 112 is already complete, i.e., with any dummy gates replaced. Metal gate structures 112 may cover one or more active semiconductor regions 110 (three shown in FIG. 1) positioned above substrate 114, e.g., by coating exposed sidewalls and an upper surface of active semiconductor region(s) 110. Metal gate structures 112 may include one or more conductive components for providing a gate terminal of a transistor. For example, metal gate structures 112 may include a high dielectric constant (high-K) layer 140, a work function metal (WFM) 142 and a gate metal conductor 144. WFM 142 is over high-K layer 140, and gate metal conductor 144 is over WFM 142. High-K layer 140 may include any now known or later developed high-K material typically used for metal gate structures 112 such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). WFM 142 may vary depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. Gate metal conductor 144 may include any now known or later developed gate conductor such as tungsten (W).

Spacer 130 may be formed adjacent to metal gate structures 112. More particularly, spacer 130 may be positioned on adjacent vertical sidewalls of metal gate structure 112, i.e., spacer 130 abuts the sidewall of metal gate structure 112. Spacer 130 may be provided, e.g., by deposition, thermal growth, etc., on metal gate structures 112 or on dummy gates (not shown) during an RMG process. Spacer 130 may be formed on or adjacent to metal gate structure(s) 112 to electrically and physically separate metal gate structure(s) 112 from other components of preliminary structure 100, e.g., contacts 120. Spacer 130 may include a low dielectric constant (low-K) material, i.e., any dielectric material with a dielectric constant of at most approximately 3.9. Examples of a low-K material may include but is not limited to: silicon carbon oxynitride (SiCON), silicon carbon nitride (SiCN), spin-on low-K films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-K (ELk) materials (available from Applied Materials). An example of an HSQ material is FOx™ (available from Dow Corning), silicon nitride ($Si_3N_4$), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. However, spacer 130 does not include an oxide, e.g., silicon dioxide ($SiO_2$). Spacer 130 may be formed by deposition and etching.

Preliminary structure 100 formation may also include forming an inter-level dielectric (ILD) (not shown, located behind page in FIGS. 2-9), i.e., over active semiconductor region(s) 110, metal gate structure(s) 112, substrate 114, and STI(s) 116 (FIG. 1). The ILD may be formed by non-selective or selective deposition, such that the ILD initially covers at least active semiconductor region(s) 110 and metal gate structure(s) 112. ILD may include any now known or later developed ILD material such as but not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning). Contacts 120 may be formed through the ILD and between metal gate structures 112 in any now known or later developed fashion. For example, a mask 150 may be deposited and patterned and etched to create openings 124 in the ILD and between adjacent spacers 130. Alternatively, a self-aligned contact process in which spacer 130 and metal gate structure 112 direct etching may be employed. In any event, after opening formation, contact forming may include, for example: depositing a refractory metal liner (not shown), followed by depositing of a contact conductor 126, like cobalt, copper or aluminum, and then a planarizing process can remove excess conductor.

Figure 3:
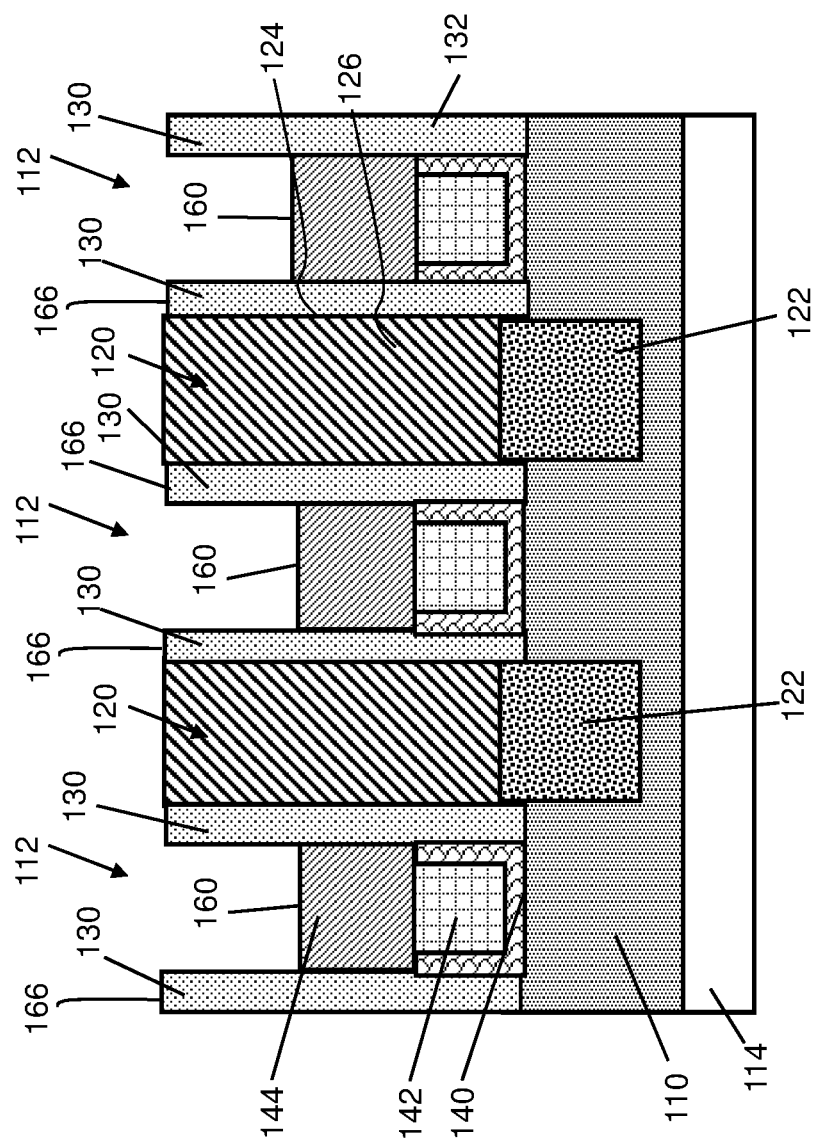
FIG. 3 shows a cross-sectional view of recessing a metal gate structure according to embodiments of the disclosure.

Referring to FIG. 3, in a next step of a method according to embodiments of the disclosure, metal gate structure 112 may be recessed. The recessing may include any now known or later developed etching process appropriate to recess gate metal conductor 144, e.g., RIE for tungsten (W). The recessing may be self-aligned, i.e., with no mask and with spacer 130 and contact 120 directing the etching. As illustrated, after recessing, gate metal conductor 144 has an upper surface 160 that is below an upper surface 166 of spacer 130.

Figure 4:
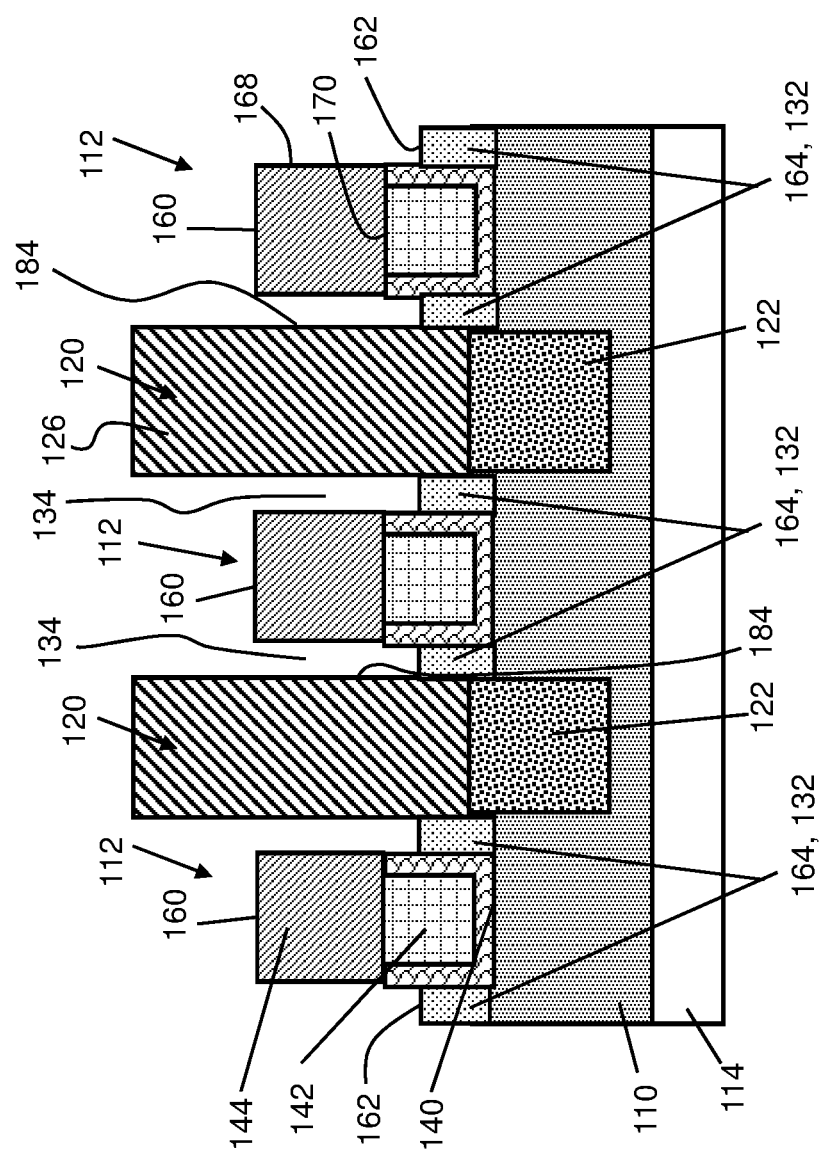
FIG. 4 shows a cross-sectional view of recessing a spacer, creating a space above a lower spacer portion, according to embodiments of the disclosure.

FIG. 4 shows recessing spacer 130 (FIG. 3) to have an upper surface 162 of first dielectric 132 thereof below upper surface 160 of metal gate structure 112. This recessing leaves a lower spacer portion 164 of first dielectric 132, and creates a space 134 between metal gate structure 112 and sidewall 184 of an adjacent contact 120. The recessing may include, for example, a RIE appropriate for first dielectric 132. In one embodiment, the recessing may include a RIE to remove an upper part of spacer 130, followed by a RIE to remove spacer 130 from a sidewall 168 of metal gate structure 112, i.e., from gate metal conductor 144 and/or high-K layer 140. During this recessing, metal gate structures 112 and contacts 120 remain intact. The amount of recessing, i.e., the depth, can be user defined based on whether space 134 created by the recessing subsequently receives oxide to re-create the spacer. In one embodiment, upper surface 162 of lower spacer portion 164 (first dielectric 132) is below an upper surface 170 of WFM 142. It is noted that where spacer 130 (FIG. 2) may include damage in or near an upper surface 166 thereof created during formation of parts of preliminary structure 100, embodiments of the disclosure remove the damage.

Figure 5:
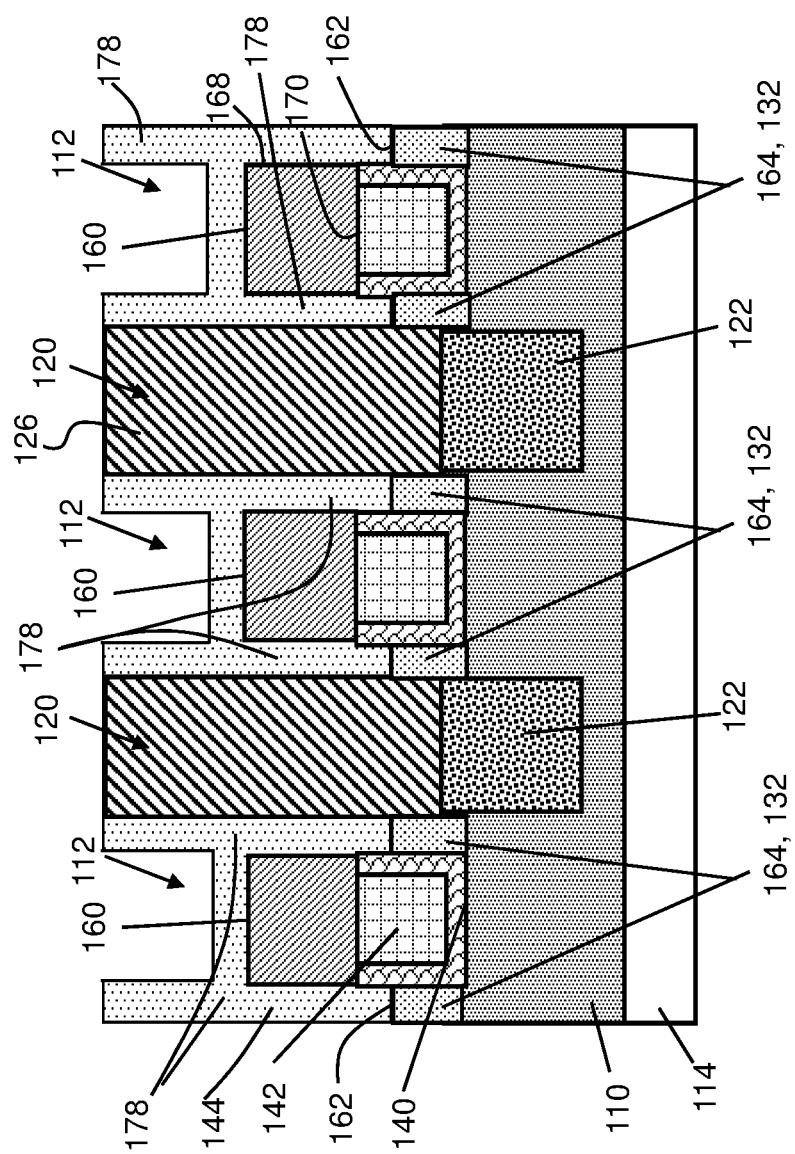
FIG. 5 shows a cross-sectional view of forming a dielectric in the space of FIG. 5, according to embodiments of the disclosure.
Figure 6A:
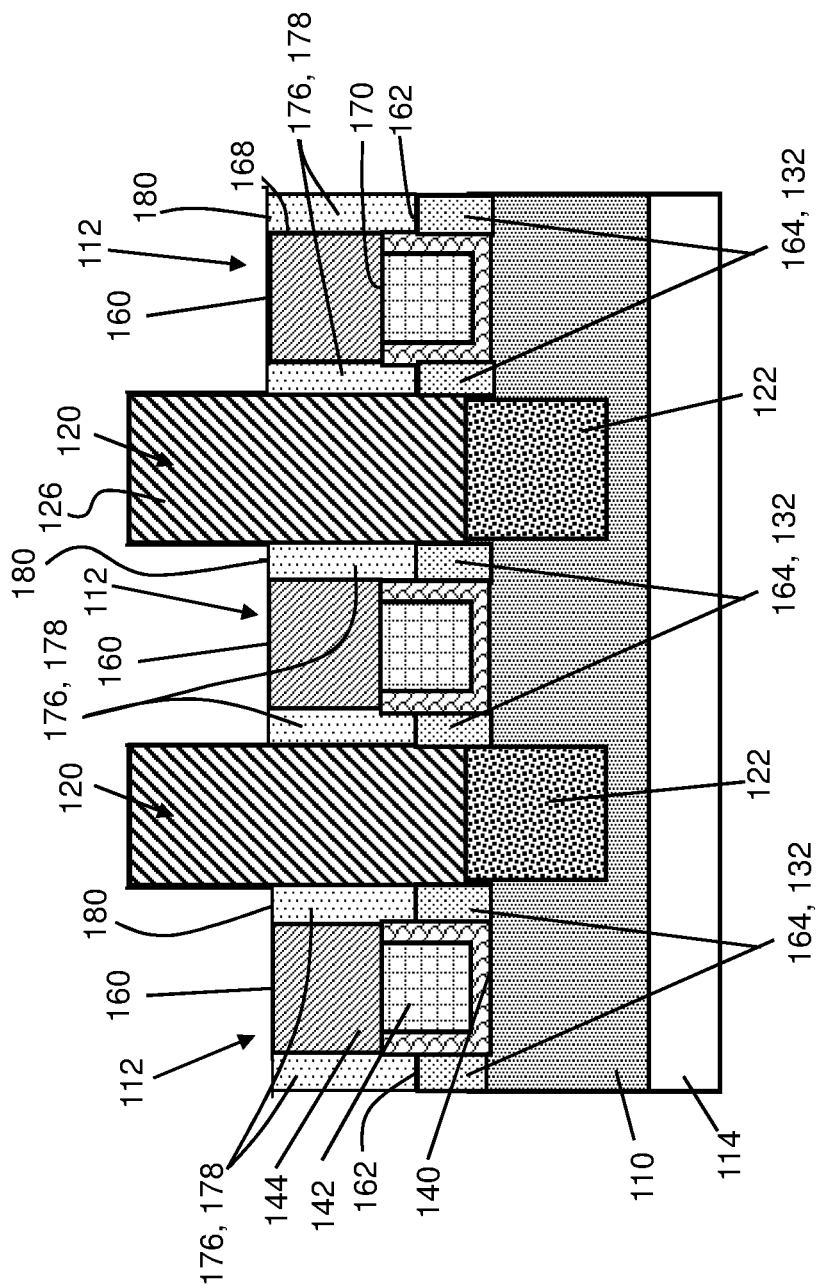
FIGS. 6A-C show cross-sectional views of recessing the dielectric, creating an upper spacer portion, according to various embodiments of the disclosure.
Figure 6B:
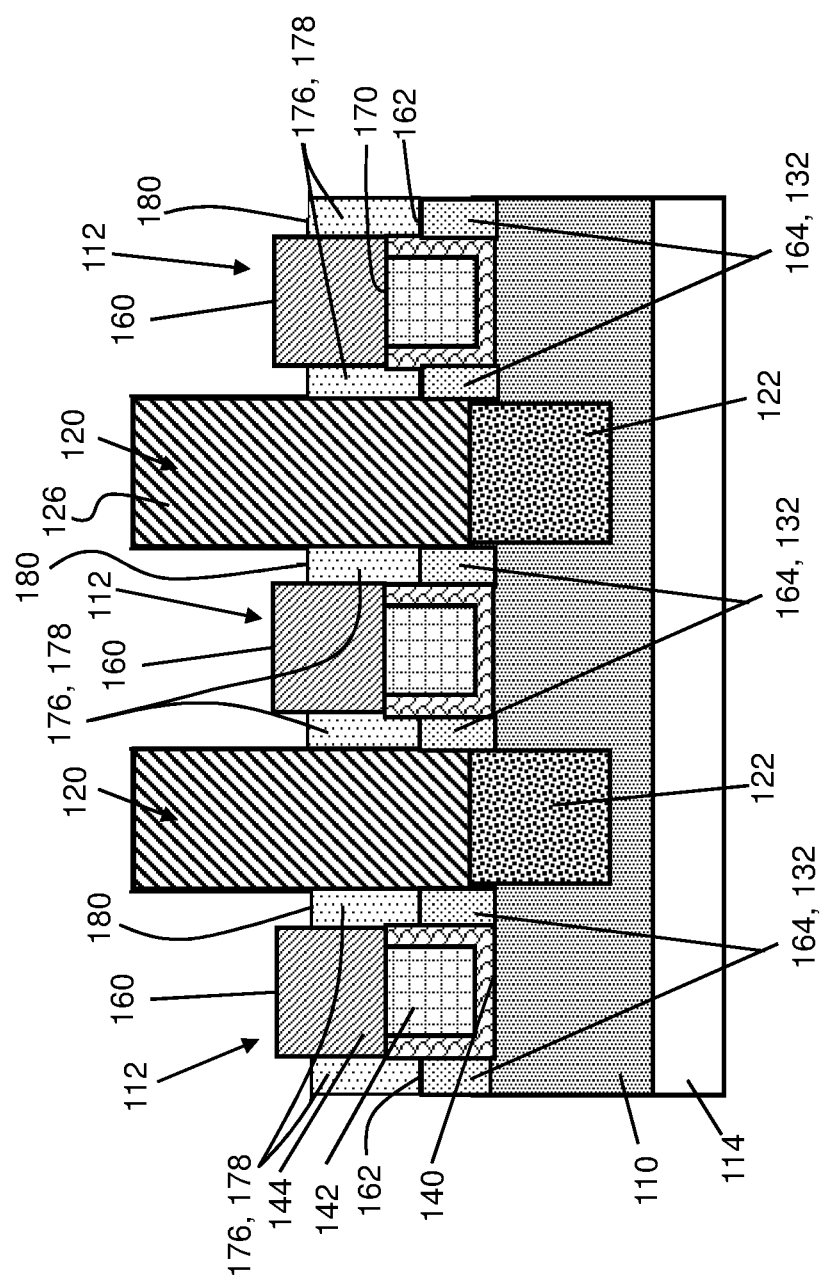
Figure 6C:
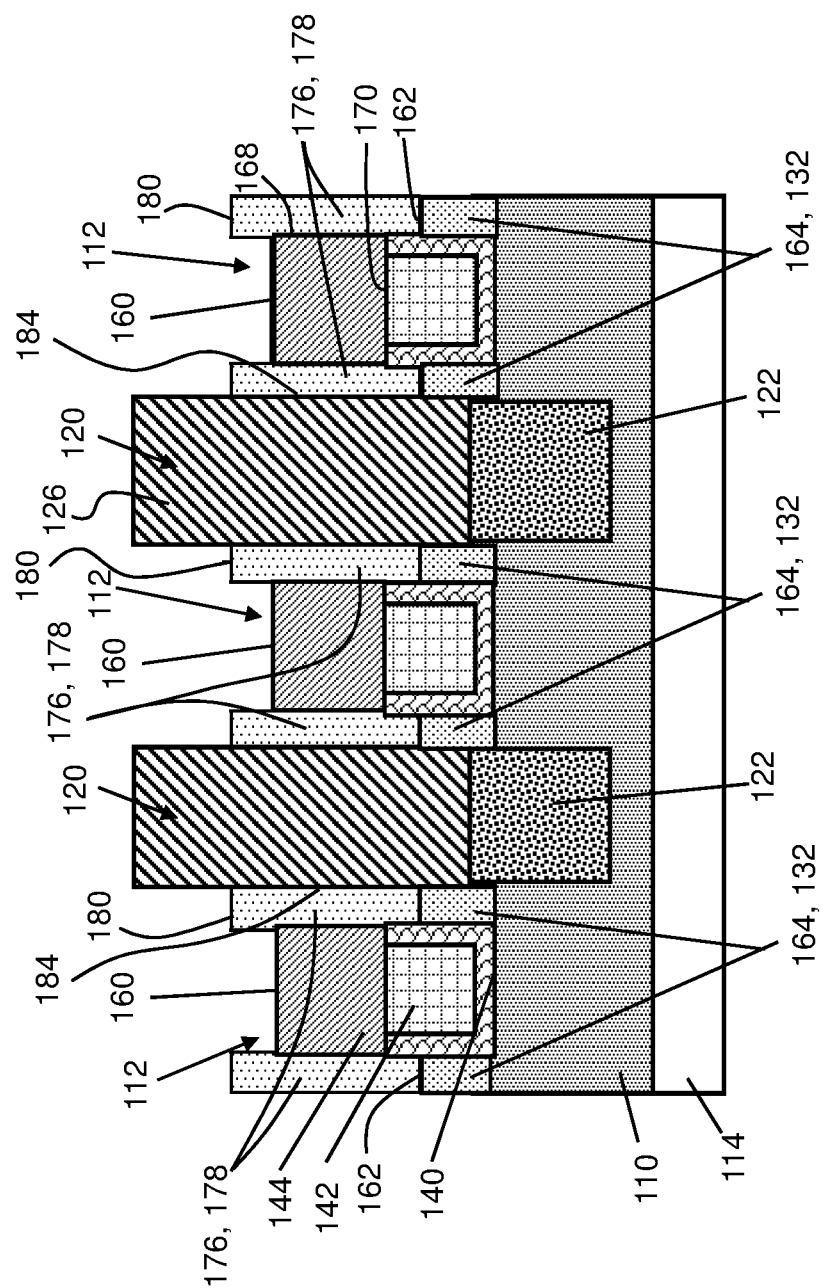

FIGS. 5 and 6A-C show forming an upper spacer portion 176 (FIG. 6) over lower spacer portion 164, i.e., in space 134 created by recessing spacer 130 (FIG. 3). Upper spacer portion 176 includes a second dielectric 178 having a dielectric constant (K2) lower than first dielectric 132, i.e., K2<K1. In one embodiment, second dielectric 178 may include silicon carbon nitride (SiCN), or an oxide such as silicon dioxide ($SiO_2$). This process may include, as shown in FIG. 5, depositing second dielectric 178 (FIG. 5), e.g., via ALD oxide, and as shown in FIGS. 6A-C, etching second dielectric 178 to create upper spacer portion 176. The etching may include any appropriate chemistry for a spacer etch back of an oxide.

FIGS. 6A-C show a number of different embodiments illustrating the extent to which second dielectric 178 can be etched back. In FIG. 6A, second dielectric 178 is etched to form upper spacer portion 176 to have an upper surface 180 substantially coplanar with upper surface 160 of metal gate structure 112, i.e., even or close to even (within +/−5 nanometers) with upper surface 160 of gate metal conductor 144. In FIG. 6B, second dielectric 178 is etched to form upper spacer portion 176. Upper spacer portion 176 has an upper surface 180 thereof below upper surface 160 of metal gate structure 112. In FIG. 6C, second dielectric 178 is etched to form upper spacer portion 176 to have upper surface 180 above upper surface 160 of metal gate structure 112. Regardless of embodiment, upper spacer portion 176 and lower spacer portion 164 abut sidewall 168 of metal gate structure 112 and abut a sidewall 184 of each contact 120. As shown in FIGS. 6A-C, an interface between upper spacer portion 176 and lower spacer portion 164, i.e., at upper surface 162 of lower spacer portion 164, may be below upper surface 170 of WFM 142. FIGS. 6A-C also show a new spacer 182 adjacent metal gate structure 112. Spacer 182 includes lower spacer portion 164 including first dielectric 132 having first dielectric constant K1 and upper spacer portion 176, including second dielectric 178 having dielectric constant K2 lower than first dielectric 132, i.e., K2<K1. Hence, spacer 182 is a two portion or two layered, stacked spacer.

Figure 7A:
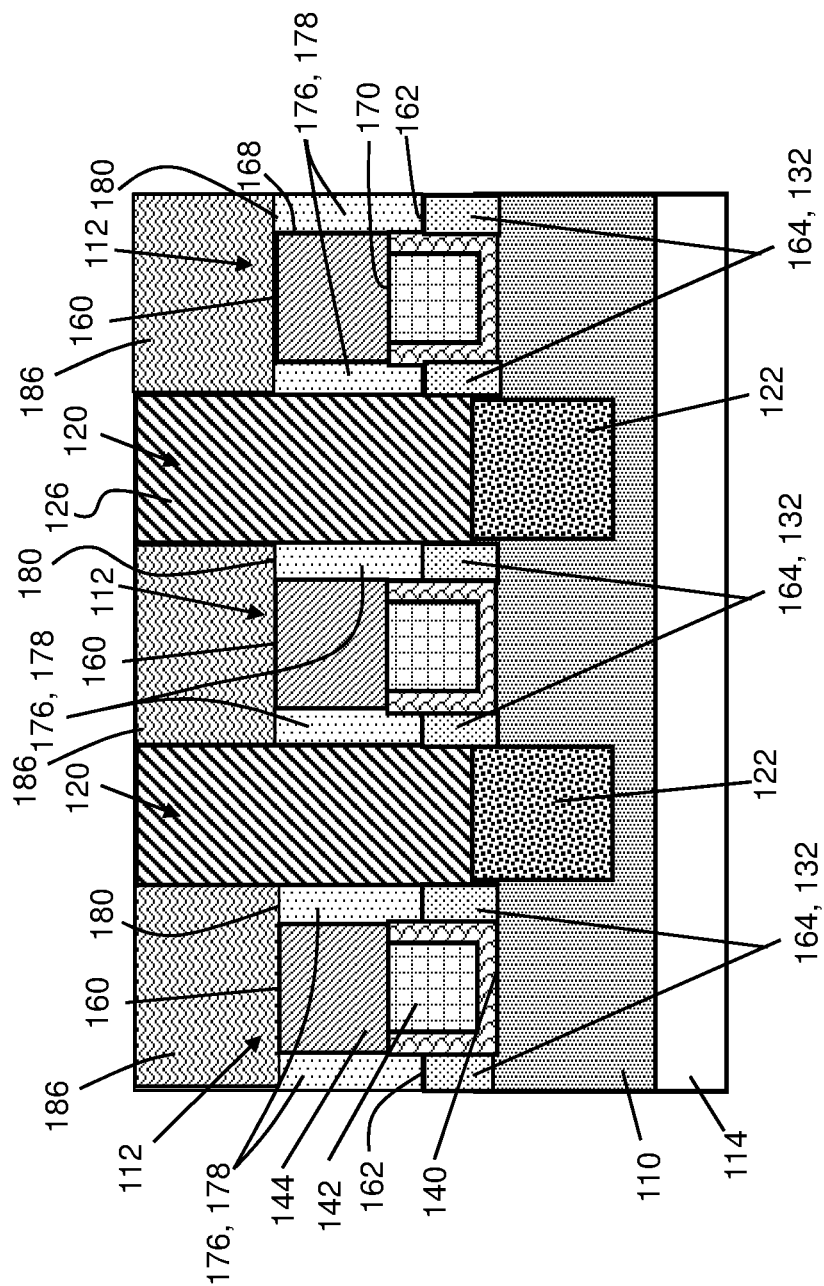
FIGS. 7A-C show cross-sectional views of forming a gate cap according to various embodiments of the disclosure.
Figure 7B:
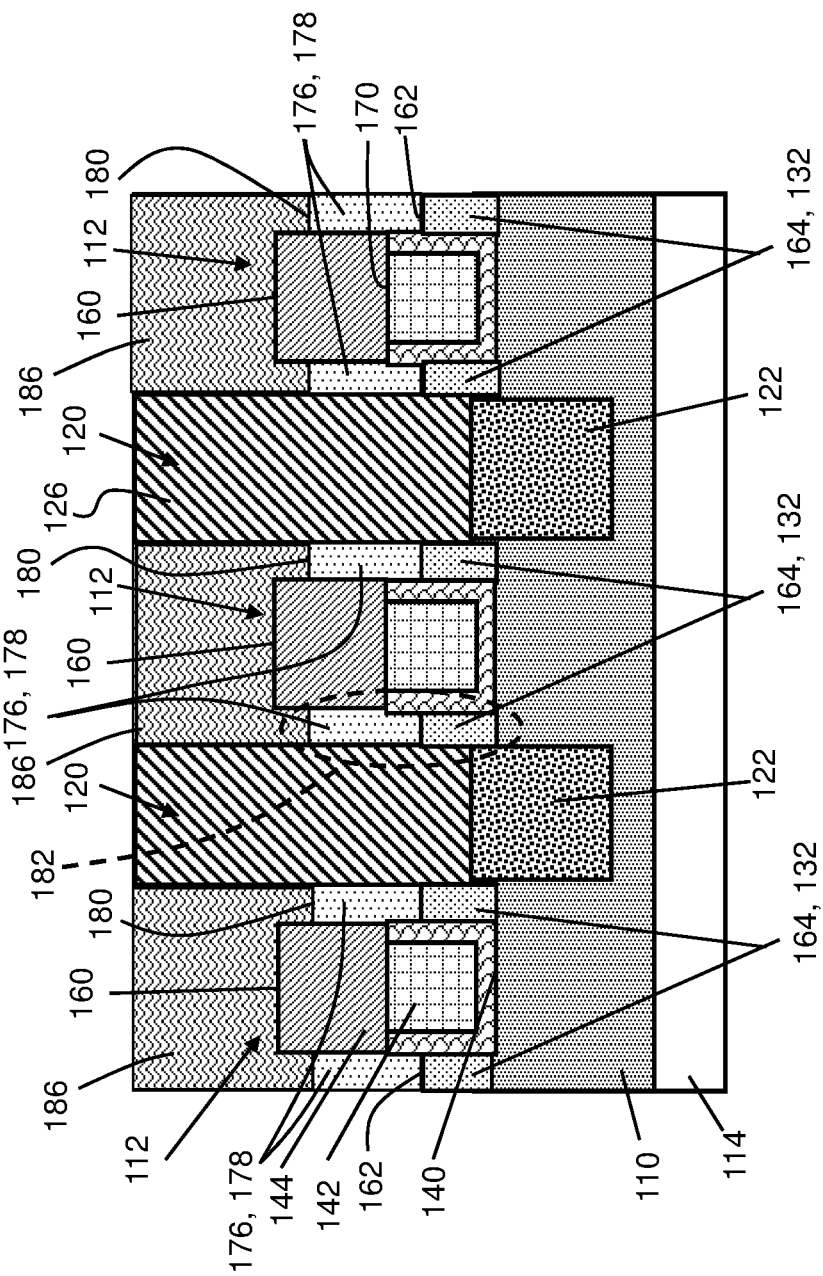
Figure 7C:
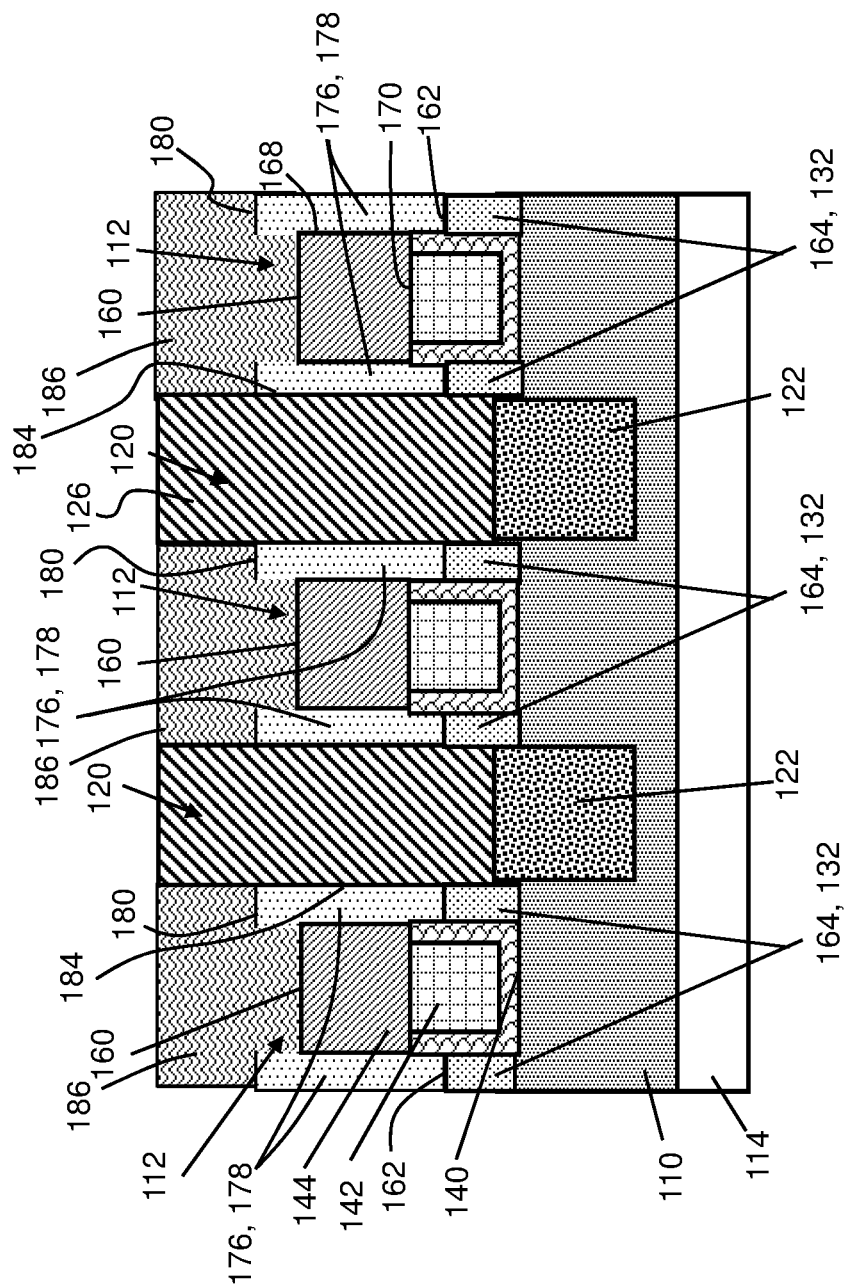

FIGS. 7A-C show forming a gate cap 186 over metal gate structure 112 and upper spacer portion 176 relative to the FIGS. 6A-C embodiments, respectively. Gate cap 186 may include any appropriate gate cap material, such as but not limited to silicon carbon nitride (SiCN) or silicon nitride ($Si_3N_4$), and may be formed by any appropriate deposition technique followed by a planarization to remove excess material. FIG. 7A shows the FIG. 6A embodiment with gate cap 186. FIG. 7B shows the FIG. 6B embodiment in which second dielectric 178 has upper surface 180 of upper spacer portion 176 below upper surface 160 of metal gate structure 112, and gate cap 186 has a U-shape cross-section. More particularly, gate cap 186 has an inverted U-shape cross-section near a lower end thereof. FIG. 7C shows the FIG. 6C embodiment in which upper surface 180 of upper spacer portion 176 is above upper surface 160 of metal gate structure 112. Here, as shown in FIG. 7C, gate cap 186 has a T-shape cross-section. More specifically, gate cap 186 has a T-shape cross-section near a lower end thereof. In any event, gate cap 186 contacts a portion of sidewall 184 of each contact 120, where a gate cap would normally contact a spacer.

Figure 8A:
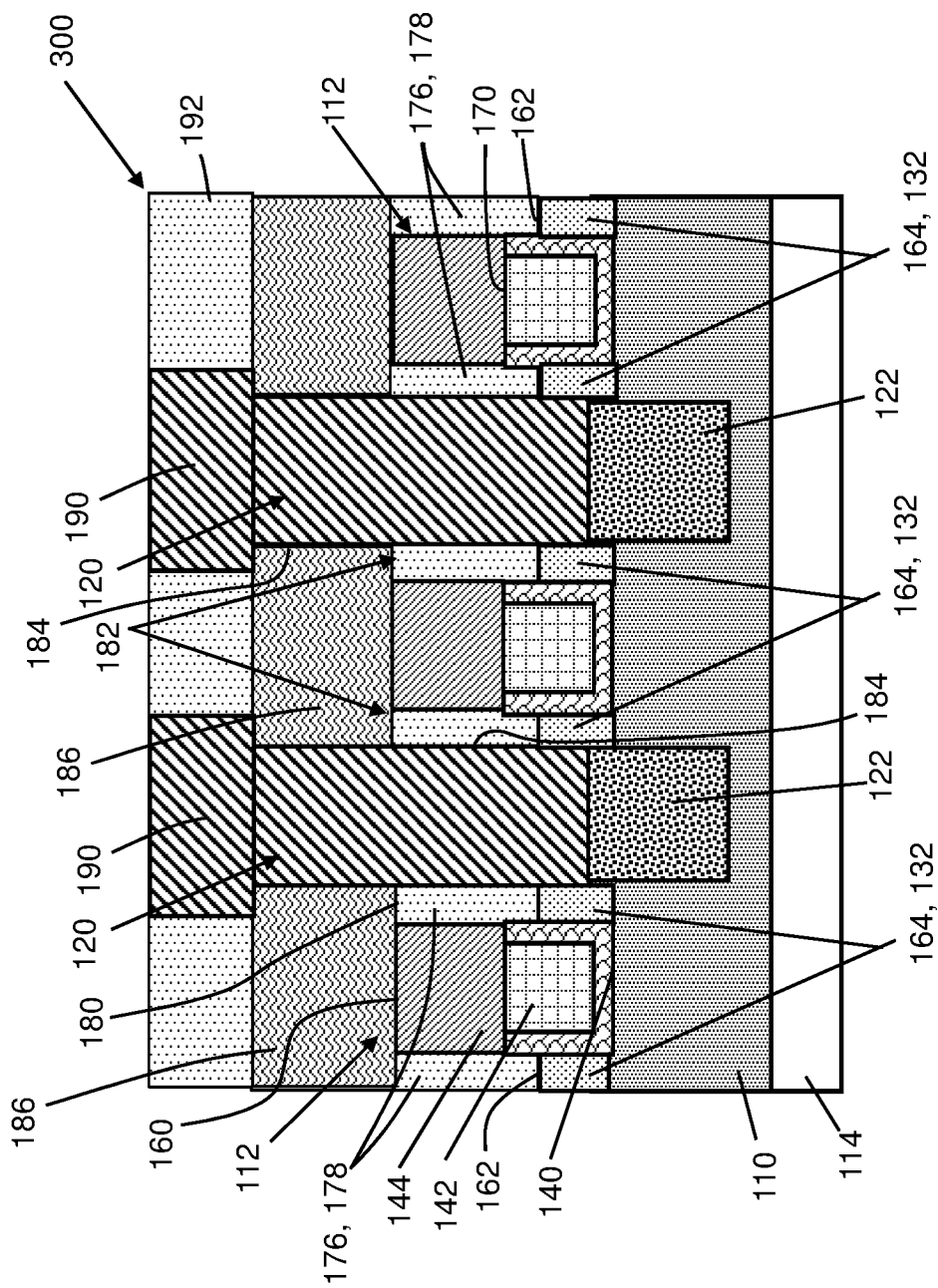
FIGS. 8A-C show cross-sectional views of forming a contact layer to contacts of an IC structure and an IC structure, according to various embodiments of the disclosure.
Figure 8B:
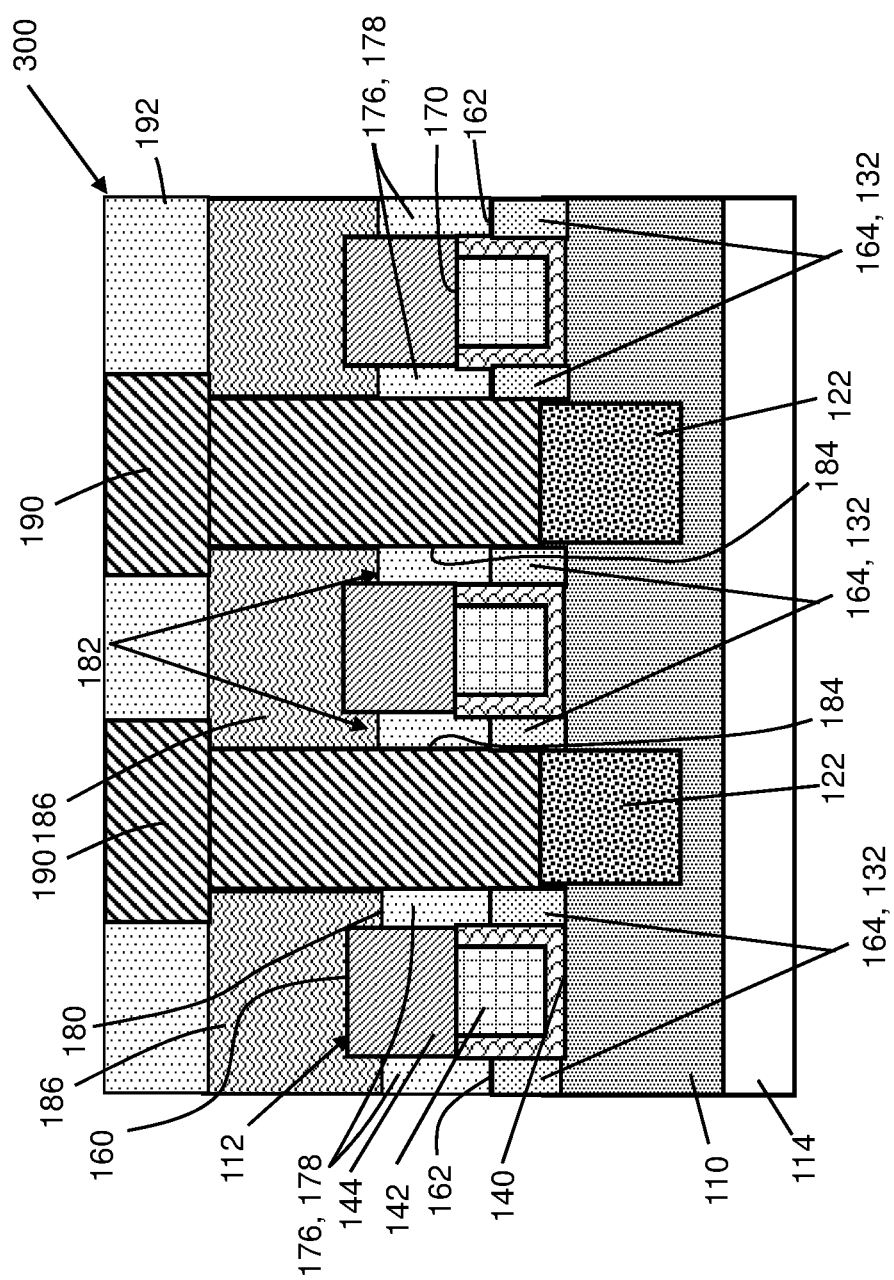
Figure 8C:
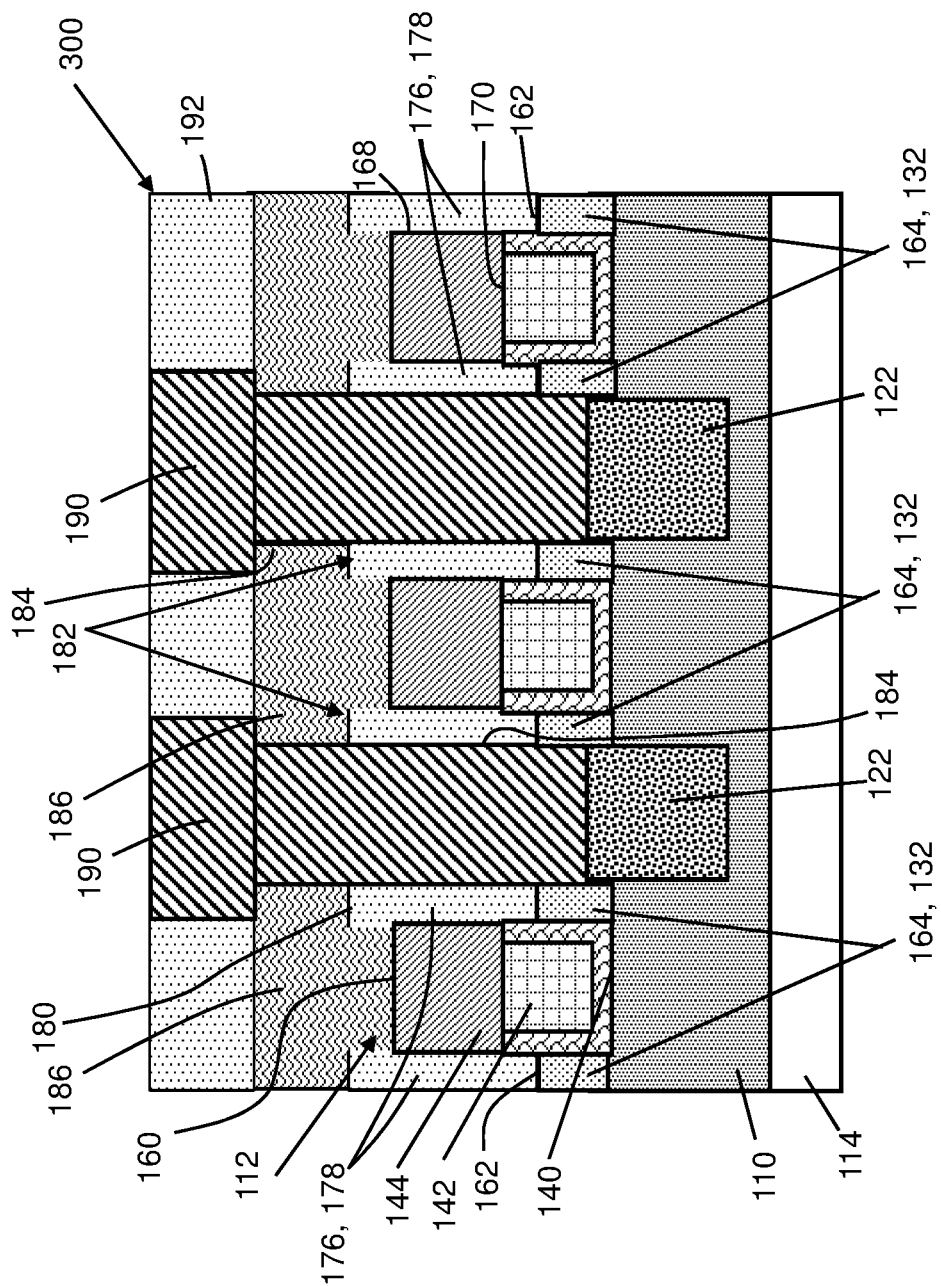

FIGS. 8A-C show optional steps of forming first via level (V1) contacts 190 to contacts 120 as part of middle-of-line processing (contacts 120 may be referred to as zero via level (V0) contacts). V1 contact 190 formation occurs after forming gate cap 186. V1 contacts 190 may be formed, for example, by forming an insulator 192 over gate cap 186 and each contact 120 to pair of source/drain regions 122. Insulator 192 may include any ILD material listed herein. V1 contact 190 formation may further include removing a portion of insulator 192 to expose an upper surface of each contact 120, e.g., using a mask (not shown) deposited, patterned and etched to create V1 contact 190 openings. Each V1 contact 190 is then formed by, for example, depositing refractory metal liner (not shown), followed by deposition of a contact conductor 126, like cobalt, copper or aluminum, and then a planarizing to remove excess conductor. FIG. 8A shows the FIG. 7A embodiment with V1 contacts 190; FIG. 7B shows the FIG. 7B embodiment with V1 contacts 190; and FIG. 8C shows the FIG. 7C with V1 contacts 190.

Figure 9:
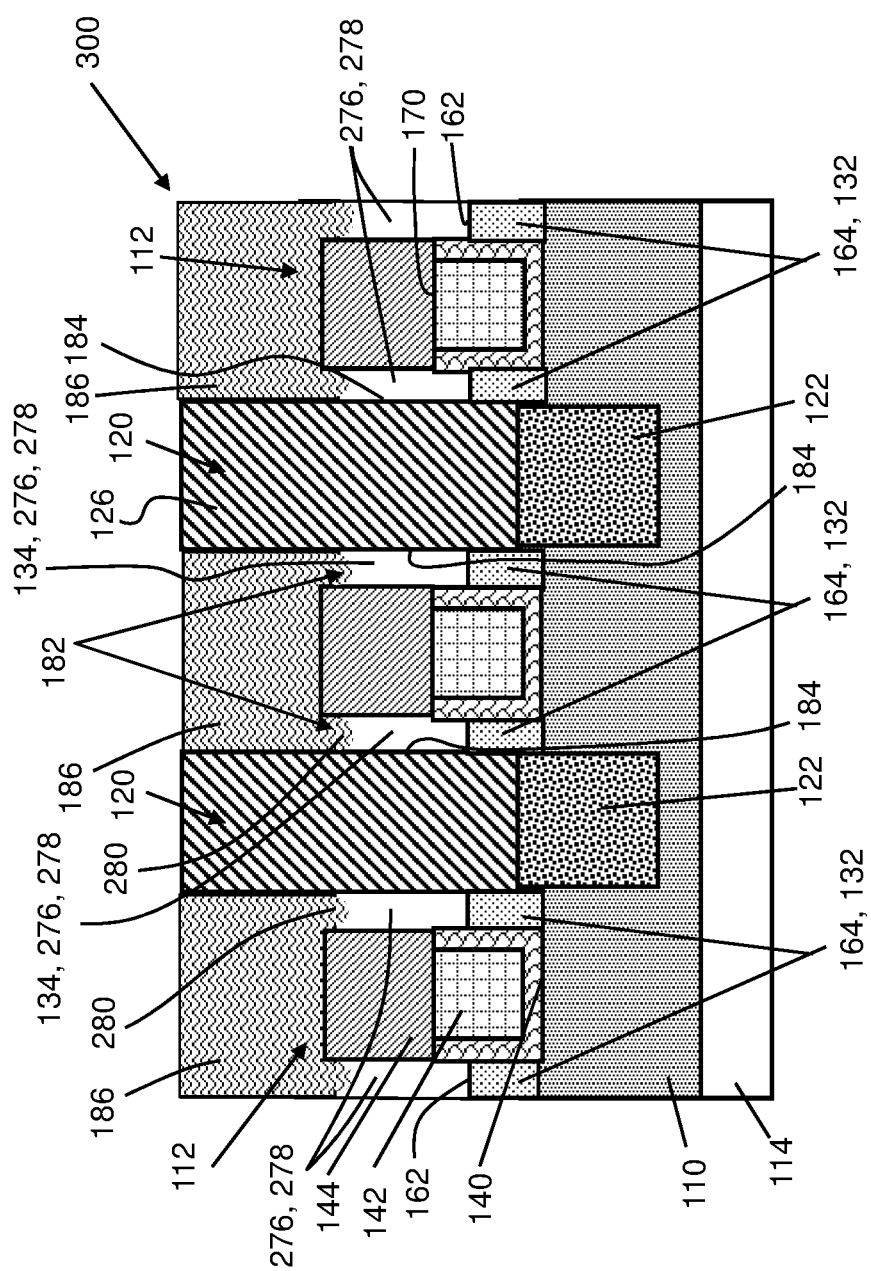
FIG. 9 shows a cross-sectional view of forming an upper spacer portion with a gas dielectric and an IC structure, according to another embodiment of the disclosure.

Referring again to FIG. 4 and also to FIG. 9, where space 134 (FIG. 4) vacated during recessing of spacer 130 (FIG. 3) to create lower spacer portion 164 is too small to receive second dielectric 178 (FIGS. 5-6A-C) such as an oxide, forming an upper spacer portion 276 may include forming gate cap 186 to seal space 134 between metal gate structure 112 and sidewall 184 of an adjacent contact 120. Here, upper spacer portion 276 includes a second dielectric 278 in the form of a gas dielectric, e.g., air, which has a lower dielectric constant K2 less than first dielectric 132, i.e., K2<K1. In this setting, gate cap 186 may include dimples 280, e.g., small extensions, extending into space 134 between metal gate structure 112 and sidewall 184 of adjacent contact 120, i.e., where it pinches off space 134. V1 contacts (not shown in FIG. 9) may be formed to contacts 120 in FIG. 9 similarly to that described relative to FIGS. 8A-C.

Embodiments of an IC structure 300 according to embodiments of the disclosure are shown in FIGS. 8A-C and 9. IC structure 300 may include metal gate structure 112 over active semiconductor structure 110 over substrate 114. Metal gate structure 112 may include WFM 142 and gate metal conductor 144 over WFM 142. Spacer 182 is adjacent metal gate structure 112. Spacer 182 includes a lower spacer portion 164 including first dielectric 132 having first dielectric constant K1 and an upper spacer portion 176, 276 (FIGS. 8A-C and 9, respectively), including second dielectric 178, 278 having dielectric constant K2 lower than first dielectric 132, i.e., K2<K1. In one example, first dielectric 132 may include low-K material, and second dielectric 178 may include silicon oxide. In another example, first dielectric 132 may include low-K material, and second dielectric 178 may include a gas dielectric, like air. An interface (at upper surface 162 of lower spacer portion 164) between upper spacer portion 176 and lower spacer portion 164 may be below upper surface 170 of WFM 142. IC structure 300 may also include contact(s) 120 to each of pair of S/D regions 122 in or on substrate 114. As illustrated, each contact 120 abuts spacer(s) 182.

IC structure 300 also includes gate cap 186 over metal gate structure 112 and upper spacer portion 176, 276 of spacer 182. In one embodiment, shown in FIG. 8A, upper surface 180 of upper spacer portion 176 is substantially coplanar with upper surface 160 of metal gate structure 112. In another embodiment, shown in FIG. 8B, upper surface 180 of upper spacer portion 176 is below upper surface 160 of metal gate structure 112, making gate cap 186 have an (inverted) U-shape cross-section. In yet another embodiment, shown in FIG. 8C, upper surface 180 of upper spacer portion 176 is above upper surface 160 of metal gate structure 112, making gate cap 186 have a T-shape cross-section. In another embodiment, shown in FIG. 9, upper spacer portion 276 includes second dielectric 278 in the form of a gas dielectric. Here, gate cap 186 may include dimples 280 extending into space 134 between metal gate structure 112 and sidewall 184 of adjacent contact 120 to form gas dielectric 278. In any event, gate cap 186 contacts a portion of sidewall 184 of each contact 120, where typically a gate cap would contact a spacer. Further, both upper spacer portion 176, 276 and lower spacer portion 164 abut sidewall 184 of metal gate structure 112 and abut sidewall 184 of contact(s) 120.

Embodiments of the disclosure allows replacement of a completely low-K spacer with a two portion spacer (with low-K portion and oxide portion), after contact formation and metal gate structure formation. The teachings of the disclosure reduce effective capacitance to boost device performance. In addition, embodiments of the disclosure enlarge process margins for gate height control and gate-to-contact shorts because the process occurs after contact and metal gate structure formation. Aspects of the disclosure can be applied to FinFETs, and can be applied to a 7 nanometer technology node and beyond. Where spacer 130 (FIG. 3) includes damage in or near an upper surface 166 (FIG. 3) thereof created during formation of parts of preliminary structure 100, embodiments of the disclosure remove the damage, replacing it with upper spacer portion 176, 276.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
  a metal gate structure over an active semiconductor structure over a substrate, the metal gate structure including:
    a gate dielectric layer,
    a work function metal (WFM) on the gate dielectric layer, wherein portions of the gate dielectric layer abut sidewalls of the WFM such that a top surface of the gate dielectric layer is coplanar with a top surface of the WFM, and
    a gate conductor on the WFM and the gate dielectric layer, wherein a bottom surface of the gate conductor contacts the top surface of the gate dielectric layer and the top surface of the WFM;
  a spacer adjacent the gate dielectric layer of the metal gate structure, wherein the spacer includes a lower spacer portion including a first dielectric having a first dielectric constant and an upper spacer portion including a second dielectric having a dielectric constant lower than the first dielectric constant;
  a contact to a pair of source/drain regions of the substrate, wherein the contact abuts the spacer; and
  a gate cap over the metal gate structure and the upper spacer portion of the spacer, wherein the gate cap has a T-shape cross-section having an upper portion having a first width and a lower portion having a second width, wherein a sidewall of the upper portion of the gate cap abuts the contact, and a top surface of the gate cap is substantially coplanar with a top surface of the contact, and wherein the first width is greater than the second width.

2. The IC structure of claim 1, wherein the first dielectric includes a low dielectric constant (low-K) material, wherein the second dielectric includes one of silicon dioxide and silicon carbon nitride.

3. The IC structure of claim 2, wherein a top surface of the upper spacer portion is above an upper surface of the metal gate structure, a bottom surface of the upper spacer portion borders a top surface of the lower spacer portion, and a bottom surface of the lower spacer portion is on the active semiconductor structure.

4. The IC structure of claim 1, wherein the upper spacer portion includes a gas dielectric.

5. The IC structure of claim 4, wherein the gate cap includes dimples extending into a space between the metal gate structure and a sidewall of an adjacent contact to form the gas dielectric.

6. The IC structure of claim 1, wherein both the upper spacer portion and the lower spacer portion abut a sidewall of the metal gate structure and abut a sidewall of the contact.

7. The IC structure of claim 1, further comprising an inter-level dielectric (ILD) layer, wherein the ILD layer includes a bottom surface on the top surface of the contact, and the top surface of the gate cap.

8. An integrated circuit (IC) structure, comprising:
  a metal gate structure over an active semiconductor structure over a substrate, the metal gate structure including:
    a gate dielectric layer,
    a work function metal (WFM) on the gate dielectric layer, wherein portions of the gate dielectric layer abut sidewalls of the WFM such that a top surface of the gate dielectric layer is coplanar with a top surface of the WFM, and
    a gate conductor on the WFM and the gate dielectric layer, wherein a bottom surface of the gate conductor contacts the top surface of the gate dielectric layer and the top surface of the WFM;
  a spacer adjacent the gate dielectric layer of the metal gate structure, wherein the spacer includes a lower spacer portion including a first dielectric including a low dielectric constant (low-K) material and an upper spacer portion including a gas dielectric material and a second dielectric, wherein a top surface of the upper spacer portion is above a top surface of the metal gate structure, wherein the low dielectric constant material of the first dielectric has a first low dielectric constant and the second dielectric includes a second low dielectric constant, and wherein the second low dielectric constant is lower than the first low dielectric constant material;
  a contact to a pair of source/drain regions of the substrate, wherein the contact abuts the spacer; and
  a gate cap over the metal gate structure and the upper spacer portion of the spacer, wherein the gate cap includes:
    a T-shape cross-section having an upper portion having a first width and a lower portion having a second width, wherein the first width is greater than the second width, wherein a sidewall of the upper portion of the gate cap abuts the contact
    a first portion on the metal gate structure and laterally abutting the upper spacer portion of the spacer, and
    a second portion on the first portion and over the upper spacer portion of the spacer, wherein the second portion laterally abuts the contact and includes a top surface substantially coplanar with a top surface of the contact.

9. The IC structure of claim 8, wherein the gate cap includes dimples extending into a space between the metal gate structure and a sidewall of an adjacent contact to form the gas dielectric.

10. The IC structure of claim 8, wherein both the upper spacer portion and the lower spacer portion abut a sidewall of the metal gate structure and abut a sidewall of the contact.

11. The IC structure of claim 8, further comprising an inter-level dielectric (ILD) layer over the gate cap, wherein the ILD layer includes a bottom surface on the top surface of the contact, and the top surface of the gate cap.

12. An integrated circuit (IC) structure, comprising:
   a metal gate structure over an active semiconductor structure over a substrate, the metal gate structure including:
      a gate dielectric layer,
      a work function metal (WFM), wherein portions of the gate dielectric layer abut sidewalls of the WFM such that a top surface of the gate dielectric layer is coplanar with a top surface of the WFM, and
      a gate metal conductor over the WFM, wherein a bottom surface of the gate conductor contacts the top surface of the gate dielectric layer and the top surface of the WFM;
   a spacer adjacent and contacting the metal gate structure, wherein the spacer includes a lower spacer portion including a first dielectric having a first dielectric constant and an upper spacer portion including a second dielectric having a dielectric constant lower than the first dielectric, wherein an interface between the upper spacer portion and the lower spacer portion is below an upper surface of the WFM, wherein a top surface of the upper spacer portion is above an upper surface of the metal gate structure, a bottom surface of the upper spacer portion borders a top surface of the lower spacer portion, and a bottom surface of the lower spacer portion is on the active semiconductor structure, and wherein the lower spacer portion has a topmost surface under the top surface of the gate dielectric layer and the top surface of the WFM;
   a contact to a pair of source/drain regions in or on the substrate, wherein each of the upper spacer portion and the lower spacer portion abut a sidewall of the metal gate structure; and
   a gate cap over the metal gate structure and the upper spacer portion of the spacer, wherein the gate cap has a T-shape cross-section having an upper portion and a lower portion, wherein a sidewall of the upper portion of the gate cap abuts the contact, and a top surface of the gate cap substantially coplanar with a top surface of the contact.

13. The IC structure of claim 12, wherein the upper spacer portion includes a gas dielectric, and wherein the gate cap includes dimples extending into a space between the metal gate structure and a sidewall of the adjacent contact to form the gas dielectric.

14. The IC structure of claim 12, wherein the first dielectric includes a low dielectric constant (low-K) material.

15. The IC structure of claim 12, wherein the second dielectric includes one of silicon dioxide or silicon carbon nitride.

* * * * *